United States Patent [19]
Yoshikawa

[11] Patent Number: 5,898,627
[45] Date of Patent: Apr. 27, 1999

[54] SEMICONDUCTOR MEMORY HAVING REDUNDANT MEMORY CELL ARRAY

[75] Inventor: Takashi Yoshikawa, Tokyo, Japan

[73] Assignee: Oki Electric Industry Co., Ltd., Tokyo, Japan

[21] Appl. No.: 09/115,688

[22] Filed: Jul. 15, 1998

[30] Foreign Application Priority Data

May 8, 1998 [JP] Japan ................................. 10-125730

[51] Int. Cl.$^6$ ........................................................ G11C 7/00
[52] U.S. Cl. .................... 365/200; 365/230.06; 365/201; 365/230.08
[58] Field of Search .................... 365/200, 201, 365/230.06, 230.08, 189.01

[56] References Cited

U.S. PATENT DOCUMENTS 5,349,556  9/1994  Lee ............................................ 365/200

FOREIGN PATENT DOCUMENTS 2-210686  8/1990  Japan .

Primary Examiner—David Nelms
Assistant Examiner—David Lam
Attorney, Agent, or Firm—Jones, Volentine, Steinberg & Whitt, L.L.P.

[57] ABSTRACT

To make a read/write test on a redundant memory and to realize the detection of faults of the redundant memory cell array in advance, there are provided a first control circuit which inhibits the activation of word lines for selecting a normal memory cell array in response to a test signal and a second control circuit which activates redundant word lines for selecting a redundant memory cell array in response to the test signal.

15 Claims, 6 Drawing Sheets

SEMICONDUCTOR MEMORY HAVING REDUNDANT MEMORY CELL ARRAY

BACKGROUND OF THE INVENTION

1. Field of the Invention

The invention relates to a semiconductor memory, particularly to a semiconductor memory having a redundant memory cell array.

2. Description of Related Art

A read/write memory (hereinafter referred as RAM) and a read only memory (hereinafter referred after as ROM) are known as a prior art semiconductor memory. A dynamic random access memory (hereinafter referred after as DRAM) or a static random access memory (hereinafter referred after as SRAM) are known as the RAM An electrically erasable programmable ROM (hereinafter referred after as EEPROM) or a mask ROM or the like are known as the ROM.

In the semiconductor memory set forth hereinbefore, particularly a RAM having a redundant memory cell array is known. The RAM having the redundant memory cell array is, for example, disclosed in the following document.

(1) Japanese Patent Laid-Open Publication No. 2-210686.

As disclosed in this document, a redundant memory cell array is remedy means which is used when faulty memory cells, faulty bit lines, or faulty word lines are present in a normally used memory cell array (hereinafter referred to as normal memory cell array) and the configuration using the same.

That is, when address information for selecting the faulty memory cells, the faulty bit lines or the faulty word lines is specified, the redundant memory cell array or the configuration using the same is selected without selecting the faulty memory cells, the faulty bit lines, or the faulty word lines (these faults are hereinafter referred to as faults). Even if there are faults in the normal memory cell array or the configuration using the same, the provision of the redundant memory cell array and the configuration using the same allows such semiconductor memory to operate in the same manner as the semiconductor memory having no faults.

The aforementioned faults can be found when the write/read test is made on the normal memory cell array. The test is made by writing arbitrary data on memory cells constituting the normal memory cell array and reading written data. It is possible to verify the presence or absence of the faults from the coincidence condition between the write data and read data.

If the test verifies the presence of faults, a redundant memory cell array is used instead of the faulty memory cells, the faulty bit lines or the faulty word lines.

For a write/read test on a redundant memory cell array, if the redundant memory cell is replaced by the faults, such test could be made on a part of the redundant memory cell array which has been replaced by the faults. That is, the read/write test to be made in advance on the redundant memory cell array has been difficult before the replacement thereof. Accordingly, if faults are found in a part of the redundant memory cell array which has been used for the replacement by the faults, such faults are required to be replaced again by another part of the redundant memory cell array.

To prevent the problems set forth hereinbefore, a write/read test is required to be made on the redundant memory cell array before it is replaced by faults like the write/read test to be made on a normal memory cell array.

In addition to satisfying the above requirement, it should be considered that the increase of a circuit configuration for satisfying the requirement is reduced to the utmost, the normal operation (write/read operation on the normal memory cell array) is not influenced, complexity of test operation and test time are reduced to the utmost.

It is a first object of the invention to provide a semiconductor memory capable of making a write/read test on a redundant memory cell array before replacing it by faults like the write/read on the normal memory cell array.

It is another object of the invention to reduce the increase of a circuit configuration to the utmost for achieving the first object.

It is still another object of the invention to provide a semiconductor memory capable of achieving the first object and of not influencing a normal operation.

It is still another object of the invention to provide a semiconductor memory capable of achieving the first object and of reducing complexity of test operation to the utmost.

It is still another object of the invention to provide a semiconductor memory capable of achieving the first object and of reducing test time to the utmost.

SUMMARY OF THE INVENTION

To achieve the above object, a semiconductor memory having a redundant memory cell comprising a memory cell array composed of a plurality of memory cells connected to word lines and bit lines for storing data therein, a redundant memory cell array composed of a plurality of redundant memory cells connected to redundant word lines and bit lines for storing data therein, a decoder for decoding address information and outputting decoding result, an activation circuit for controlling to activate word lines to be selected by selection information in response to the selection information or to activate redundant word lines corresponding to word lines which are inhibited in use when the word lines to be selected are inhibited in use, a first control circuit connected to the decoder and the activation circuit for receiving a control signal having a first voltage level and a second voltage level, transferring the decoding result outputted from the decoder as selection information to the activation circuit when the control signal is at the first voltage level, and for outputting inhibition information as selection information for inhibiting each of the plurality of word lines when the control signal is at the second voltage level, and a second control circuit for receiving the control signal and for selectively activating the plurality of redundant word lines when the control signal is at the second voltage level.

The semiconductor memory may further comprise a subdecoder for decoding the address information and outputting instruction information for instructing activation of the redundant word lines which are selected based on the address information, wherein the second control circuit activates the redundant word lines which are selected based on the instruction information.

Further, the semiconductor memory may have a set circuit connected to a wiring for transmitting the control signal for setting the wiring to the first voltage level.

Further, in the semiconductor memory, the set circuit may comprise resistor means connected between a wiring and means for supplying a second voltage.

Still further, the semiconductor memory may further include a counter for receiving a clock signal and counting the number of clock pulses of the clock signal and for outputting instruction information for instructing activation of the redundant word lines selected based on the number of clock pulses, and wherein the second control circuit may activates the redundant word lines selected in accordance with the instruction information.

Still further, in the semiconductor memory, the counter may initialize the number of clock pulses in response to a reset signal.

Still further, in the semiconductor memory, the second control circuit may activate all the plurality of word lines in response to the control signal having the second voltage level.

DESCRIPTION OF THE PREFERRED EMBODIMENT

Figure 1:
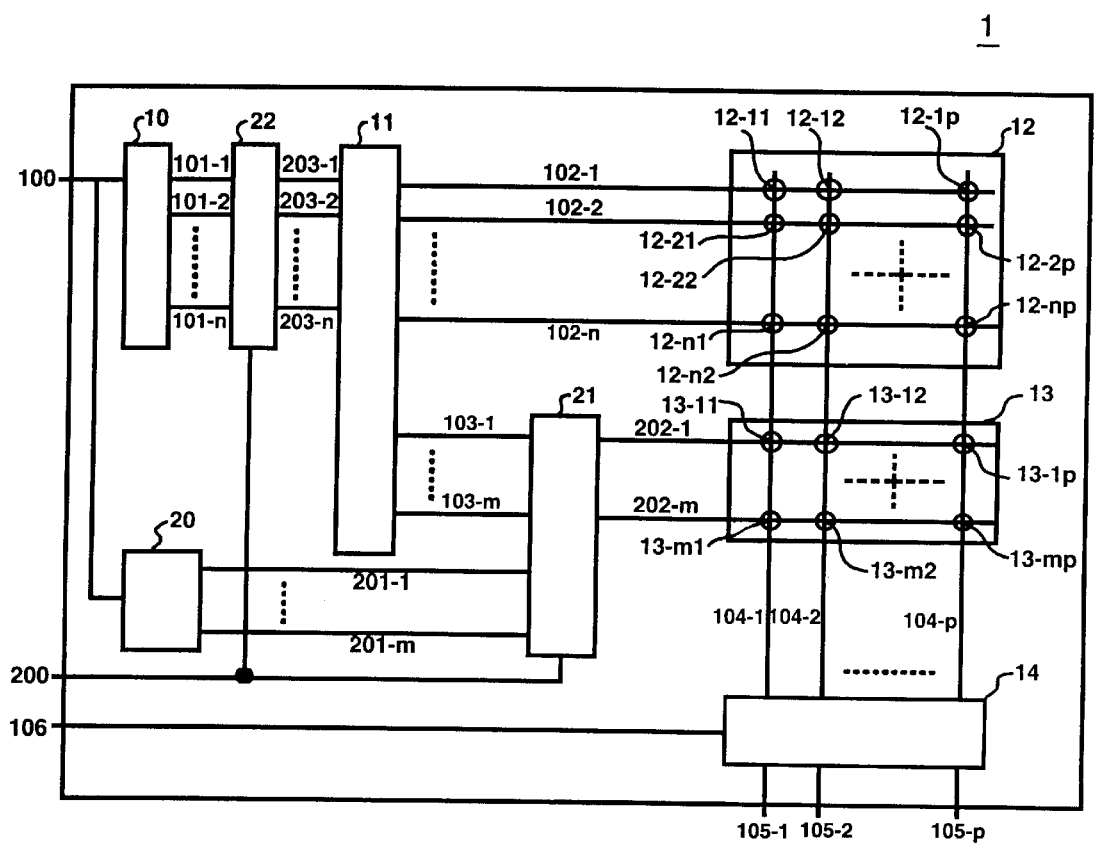
FIG. 1 is a circuit diagram of a semiconductor memory 1 according to a first embodiment of the invention.

A semiconductor memory according to the invention will be now described in detail with reference to attached drawings. A DRAM is exemplified as the semiconductor memory according to the following embodiments of the invention.
First Embodiment (FIGS. 1 to 4):

FIG. 1 is a circuit diagram of a semiconductor memory 1 according to a first embodiment of the invention.

As shown in FIG. 1, the semiconductor memory 1 comprises a decoder 10, a first control circuit 22, an activation circuit 11, a normal memory cell array 12, a redundant memory cell array 13, an input/output (i/o) circuit 14, a sub-decoder 20, and a second control circuit 21.

The decoder 10 receives address information transferred from an address bus 100, and decodes this address information. The decoder 10 outputs decoded signals 101-1~101-n as decoding result. If the address information comprises f bits (f is positive integer), n becomes $2^f$. For example, if the address information comprises 3 (=f) bits, the address information comprising 3 bits is decoded, and one of decoded signals, for example., the decoded signal 101-1 is rendered at high voltage level (for example, a power supply voltage Vdd level: hereinafter referred to as H level) while the other decoded signals 101-2~101-8 are rendered at low voltage level (for example, a ground voltage Vss level: hereinafter referred to as L level). The decoded signal 101-1 which is rendered at H level corresponds to the address information.

The first control circuit 22 receives the decoded signals 101-1~101-n outputted from the decoder 10 and controls the transfer of the decoded signals 101-1~101-n in response to the voltage level of a test signal 200 serving as a control signal. That is, if the test signal 200 is at L level, the first control circuit 22 outputs selection signals 203-1~203-n having voltage levels equivalent to those of the decoded signals 101-1~101-n as selection information. In the first embodiment, the signal 203-1 corresponding to the decoded signal 101-1 is rendered at H level, and the signals 203-2~203-n corresponding to the decoded signals 101-2~101-n are rendered at L level. Further, if the test signal 200 is at H level, the voltage levels of the selection signals 203-1~203-n as selection information are all rendered at L level and outputted from the control circuit 22 regardless of the voltage levels of the decoded signals 101-1~101-n.

Figure 2:
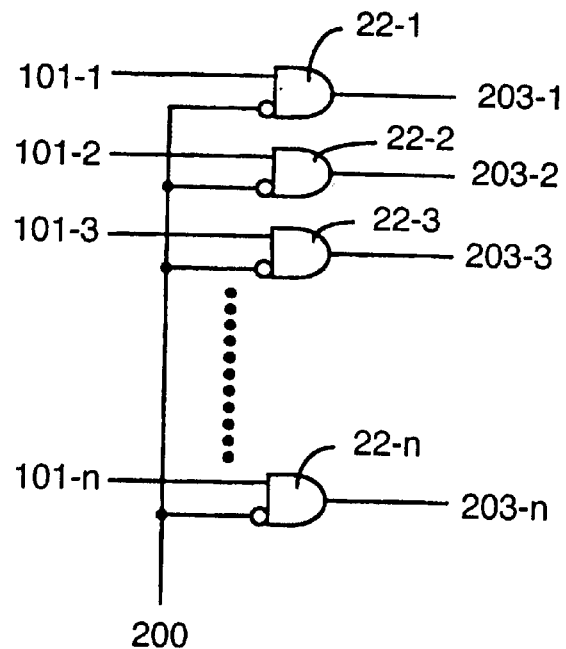
FIG. 2 is a circuit diagram of a first control circuit 22 according to the first embodiment of the invention.

A concrete circuit diagram of the first control circuit 22 is shown in FIG. 2. In FIG. 2, the first control circuit 22 comprises n AND gates 22-1~22-n. The decoded signals 101-1~101-n are inputted to respective one input terminal of the AND gates 22-1~22-n, and an inverted voltage level of the test signal 200 is commonly inputted to respective other input terminals. The operation required by the first control circuit 22 can be realized by the circuit shown in FIG. 2 although it is not limited to the first control circuit 22. That is, the first control circuit 22 controls the output of the selection signals 203-1~203-n in response to decoded signals 101-1~101-n according to the voltage level of the test signal 200.

The activation circuit 11 receives the selection signals 203-1~203-n and selectively activates (word lines which are rendered at H level in voltage level are defined as active ones, and word lines which are rendered at L level in voltage level are defined as inactive ones) word lines 102-1~102-n (or lines having the same function as the word lines) of the normal memory cell array 12 based on the selection signals 203-1~203-n. For example, in the first embodiment, the word line 102-1 corresponding to the signal 203-1 which is at H level in voltage level is activated, and the word lines 102-2~102-n corresponding to the selection signals 203-1~203-n which are at L level in voltage level are inactivated.

The activation circuit 11 has information whether redundancy process is executed or not. This information includes, for example, one which is represented by a cutting state of a fuse or one which stores word lines to be subjected to redundancy process in a memory. Such information is stored upon completion of the read/write test on the normal memory cell array 12. When such information is stored, for example, if there are faults in the word line 102-1, one of redundant word control lines (for example, a redundant word control line 103-1) for selecting the redundant memory cell array 13 instead of the word line 102-1 is activated when the signal 203-1 is at H level. Accordingly, the word lines 102-1~102-n are respectively selected in accordance with the voltage levels of the signals 203-1~203-n serving as selection information before the write/read test on the normal memory cell array 12 is made.

The normal memory cell array 12 comprises a plurality of memory cells 12-11~12-np (p is positive integer). For example, if n is 3, and p is 4, the normal memory cell array 12 comprises 12(=n×p) memory cells. Respective memory cells are arranged at portions close to intersections between the word lines 102-1~102-n (or lines having the same functions as the word lines) and the bit lines 104-1~104-p. The respective memory cells are connected to one of word lines and one of bit lines constituting the intersections. The respective memory cells are activated in word lines corresponding thereto and store therein data transferred through the bit lines or output stored data through the bit lines.

The selection of the bit lines is performed by a circuit for decoding address information such as the decoder 10, which is not illustrated in the invention.

The redundant memory cell array 13 comprises a plurality of memory cells 13-11~13-mp (m is positive integer). For example, if m is 2, and p is 4, the redundant memory cell array 13 comprises 8(=m×p) memory cells. Respective memory cells are arranged at portions close to intersections between redundant word lines 202-1~202-m and the bit lines 104-1~104-p respectively corresponding to redundant word control lines 103-1~103-m (or lines having the same function as the redundant word control lines). The respective memory cells are connected to one of redundant word lines and one of bit lines constituting the intersections. The respective memory cells are activated in redundant word lines corresponding thereto and store therein data transferred through the bit lines or output stored data through the bit lines.

Meanwhile, m is normally less than n. This is caused by the reason that the redundant memory cell array 13 forms a futile configuration when there are no faults in the normal memory cell array 12, and it is replaced by the normal memory cell array 12 if there are faults in a part of the normal memory cell array 12. The size (the number of memory cells) of the redundant memory cell array 13 may be reduced to irreducible minimum so as to allow the size of the semiconductor memory to be as small as possible.

The i/o circuit 14 controls the transfer of data between the bit lines 104-1~104-p and the i/o signals 105-1~105-p in response to a read/write signal 106. For example, if the voltage level of a read/write signal 106 is at L level, the i/o circuit 14 allows data transferred to the bit lines 104-1~104-p to transfer to the i/o signals 105-1~105-p as read instruction. If the voltage level of the read/write signal 106 is H level, the i/o circuit 14 allows data transferred to the i/o signals 105-1~105-p to transfer to the bit lines 104-1~104-p as write instruction.

The read/write signal 106 is not limited to one bit signal as mentioned above, but for example, it may be 2 bit read/write information. In this case, it is possible to set a state where neither read nor write is instructed, and if the i/o circuit 14 sets a state where neither read nor write is allowed corresponding thereto, unexpected read or write can be prevented.

A sub-decoder 20 receives and decodes the address information which is transferred from the address bus 100. The sub-decoder 20 has a circuit configuration which is the same as that of the decoder 10 in principle. However, the sub-decoder 20 controls the voltage level of the redundant word selection lines 201-1~201-m for selecting the redundant word lines 202-1~202-m. For example, if the sub-decoder 20 receives address information for instructing either of the word lines 102-1~102-m (m<n), it may allow to select render at H level either of the redundant word selection lines 201-1~201-m corresponding to the word lines 102-1~102-m.

Figure 3:
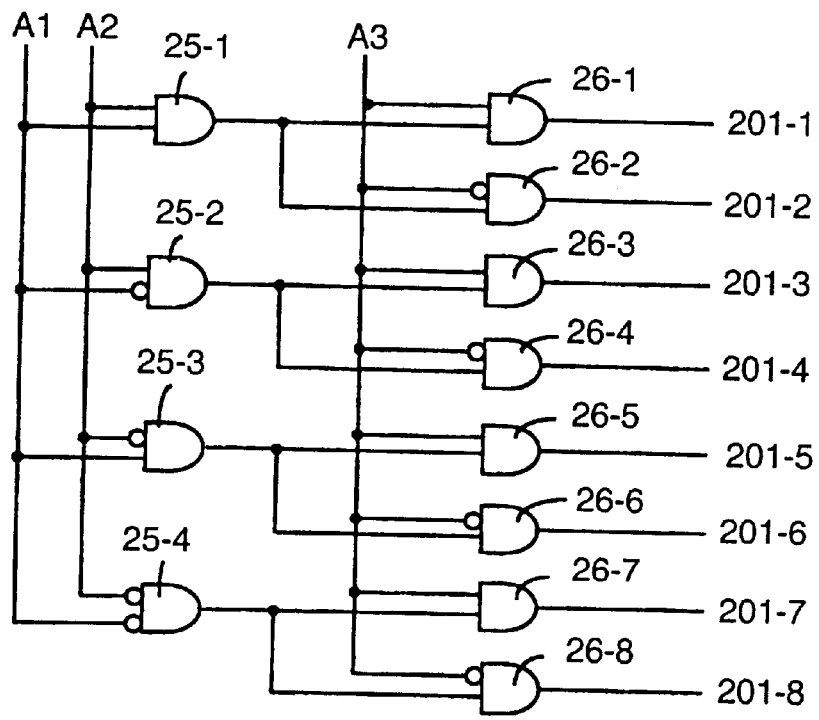
FIG. 3 is a circuit diagram of a sub-decoder 20 according to the first embodiment of the invention.

FIG. 3 is a concrete circuit diagram of the sub-decoder 20. A case where m=8 is exemplified in FIG. 3, but m is not limited to 8. The sub-decoder 20 comprises AND gates 25-1~25-4, and AND gates 26-1~26-8.

The AND gate 25-1 receives 3-bit address information A1 of address information A1~A3 at its one input terminal and receives information address A2 at its another input terminal. Likewise, the AND gate 25-2 receives a voltage level which is an inverse voltage of the address information A1 at its voltage level and the address information A2 at its input terminals. The AND gate 25-3 receives a voltage level of an inverse voltage of the address information A2 and the address information A1 at its input terminals. The AND gate 25-4 receives a voltage level of an inverse voltage of the address information A1 and a voltage level of an inverse voltage of the address information A2 at its input terminals.

The AND gate 26-1 receives an output of the AND gate 25-1 and the address information A3 at its input terminals. The AND gate 26-2 receives the output of the AND gate 25-1 and a voltage level of an inverse voltage of the address information A3 at its input terminals. The AND gate 26-3 receives an output of the AND gate 25-2 and the address information A3 at its input terminals. The AND gate 26-4 receives the output of the AND gate 25-2 and a voltage level of the inverse voltage of address information A3 at its input terminals. The AND gate 26-5 receives an output of the AND gate 25-3 and the address information A3 at its input terminals. The AND gate 26-6 receives the output of the AND gate 25-3 and the voltage level of the inverse voltage of the address information A3 at its input terminals. The AND gate 26-7 receives an output of the AND gate 25-4 and the address information A3 at its input terminals. The AND gate 26-8 receives the output of the AND gate 25-4 and the voltage level of the inverse voltage of the address information A3 at its input terminals.

Outputs of the AND gates 26-1~26-8 respectively form the redundant word selection lines 201-1~201-8. With such configuration, for example, when the address information A1~A3 are all at L level, the redundant word selection line 201-8 is rendered at H level while when the address information A1~A3 are all at H level, the redundant word selection line 201-1 is rendered at H level. In such a manner, one of the corresponding redundant word selection lines is rendered at H level in accordance with the address information. The circuit configuration of the sub-decoder 20 is not limited thereto but it may be any one having a function for selecting one of redundant word selection lines in response to address information.

The second control circuit 21 transmits voltage levels corresponding to those of the redundant word control lines 103-1~103-m which are outputted from the activation circuit 11 or transmits voltage levels corresponding to those of the redundant word selection lines 201-1~201-m respectively in response to the voltage level of the test signal 200 to the redundant word lines 202-1~202-m.

Figure 4:
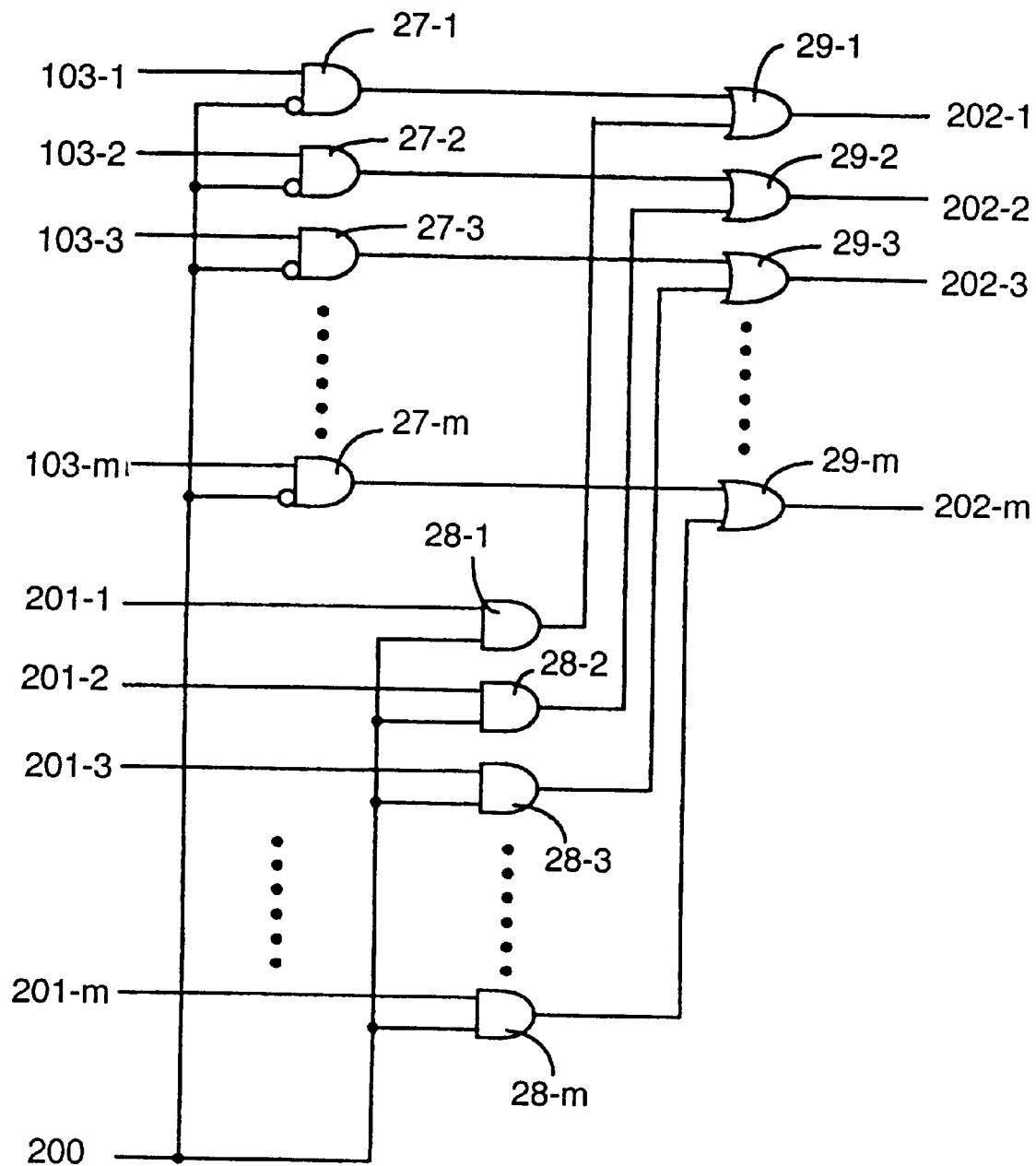
FIG. 4 is a circuit diagram of a second control circuit 21 according to the first embodiment of the invention.

FIG. 4 is a concrete circuit diagram of the second control circuit. The second control circuit 21 comprises AND gates 27-1~27-m, 28-1~28-m and OR gates 29-1~29-m.

The AND gates 27-1~27-m receive the redundant word control lines 103-1~103-m at their one input terminals. The AND gates 27-1~27-m commonly receive a voltage level of an inverse voltage level of the test signal 200 at their other input terminals.

The AND gates 28-1~28-m receive the redundant word selection lines 201-1~201-m at their one input terminals. The AND gates 28-1~28-m commonly receive the test signal 200 at their other input terminals.

The OR gate 29-1 receives an output of the AND gate 27-1 and an output of the AND gate 28-1 at its input terminals. Likewise, the OR gates 29-k (k=integer of 2 or less) receive outputs of the AND gates 27-k and outputs of the AND gates 28-k at their input terminals. Outputs of the OR gates 29-1~29-m respectively form the redundant word lines 202-1~202-m.

The operation of the second control circuit having such configuration will be described now. If the voltage level of the test signal is L level, the AND gates 27-1~27-m output signals having voltage levels corresponding to the voltage levels of redundant word control lines 103-1~103-m. At this time, the outputs of the AND gates 28-1~28-m are fixed to L level. If the voltage level of the test signal is H level, the AND gates 28-1~28-m output signals having voltage levels corresponding to the voltage levels of the redundant word selection lines 201-1~201-m. At this time, the outputs of the AND gates 27-1~27-m are fixed to L level. Since either the outputs of the AND gates 27-k or the outputs of the AND gates 28-k are fixed to L level, the outputs of the OR gates 29-k respond to voltage levels of one of the outputs of the AND gates 27-k and those of the AND gates 28-k. The circuit configuration of the control circuit is not limited thereto but it may be any one having a function for outputting voltage levels corresponding to one of those of the redundant word selection lines or those of redundant word control lines.

The operation of the semiconductor memory 1 having such configuration will be described now.

First of all, normal operation of the semiconductor memory 1 will be described. The decoder 10 decodes address information transferred from the address bus 100 and outputs the decoded signals 101-1~101-n as decoding result. The first control circuit 22 outputs the selection information 203-1~203-n based on the voltage levels of the decoded signals 101-1~101-n.

The activation circuit 11 activates one of the word lines 102-1~102-n based on the selection information 203-1~203-n or the redundant word control lines 103-1~103-m based on information whether redundancy process is executed or not.

Accompanied by the above operation, the sub-decoder 20 decodes address information transferred from the address bus 100 and outputs the redundant word selection lines 201-1~201-m as decoding result. The second control circuit 21 selects the redundant word control lines 103-1·103-m and corresponding to the voltage levels of the redundant word control lines 103-1~103-m since the voltage level of the test signal 200 is L level. In the normal operation or test on the normal memory cell array 12, described later, the output of the sub-de at L level, the operation of the sub-decoder 20 may be inhibited. In this case, the reduction of current consumption is expected.

One of memory cells of the normal memory cell array 12 or one of redundant memory cells of the redundant memory cell array 13 is selected based on selected (activated) word lines 102-1~102-n of word lines or redundant word lines of the redundant word lines 203-1~203-m and selected bit lines of the bit lines 104-1~104-p (since the selection operation of the bit lines is executed in substantially the same process as selection operation of the word line, and hence detailed explanation thereof is omitted in this embodiment).

The i/o circuit 14 outputs data read from the selected memory cells corresponding to the voltage level of the read/write signal 106 from the i/o signals 105-1~105-p, or write data transferred to the i/o signals 105-1~105-p on selected memory cells.

Test operation will be described next. The test operation is carried out before a user executes the aforementioned normal operation, for example, before shipping the semiconductor memory. First of all, test of the normal memory cell array will be described.

Suppose that the voltage level of the test signal 200 is L level. The decoder 10 decodes address information transferred from the address bus 100 and outputs the decoded signals 101-1~101-n as decoding results. Suppose that address information to be transferred is that which is inputted for test, for example, it first instructs activation of the word line 102-1. The first control circuit 22 outputs the selection information 203-1~203-n based on the voltage level of the decoded signals 101-1~101-n. The activation circuit 11 activates the word line 102-1 based on the selection information 203-1~203-n.

Accompanied by the above operation, the sub-decoder 20 decodes address information transferred from the address bus 100 and outputs the redundant word selection lines 201-1~201-m as recording results. The second control circuit 21 selects the redundant word control lines 103-1~103-m and outputs the redundant word lines 202-1~202-m having voltage levels corresponding to the voltage levels of the redundant word control lines 103-1~103-m since the voltage level of the test signal 200 is L level. However, at the test time, the activation circuit 11 is not subjected to redundancy process, the voltage levels of the redundant word lines 202-1~202~m are all L level (not activated).

Desired test data are written on the memory cells 12-11~12-1p which are selected by the activation of the word line 102-1. The write of data are performed by rendering the read/write signal 106 to be write instruction (for example, H level), and transferring desired write data from the i/o signals 105-1~105-p to the bit lines 104-1~104-p through the i/o circuit 14 so as to complete the above write of data.

When data are written, the selection of the bit lines 104-1~104-p may be performed by simultaneously selecting all the bit lines 104-1~104-p or by selecting one of bit lines 104-1~104-p (for example, bit line 104-1) first, then subsequently selecting remaining bit lines (in the order of bit lines 104-2~104-p). In the former case, time required for write is reduced.

The above operation is carried out in the manner that test address information for subsequently selecting remaining word lines 102-1~102-n is inputted and respective word lines 102-1~102-n are activated. Finally, desired data are written on all the memory cells 12-1~12-np constituting the normal memory cell array 12.

Next, first of all, for example, the word line 102-1 is activated like the write operation while the voltage level of the test signal 200 remains L level One of or all of the bit lines 104-1~104-p are selected as set forth above.

Suppose that the read/write signal 106 is read instruction (for example, L level). The i/o circuit 14 outputs data, which are read from memory cells and transferred to the bit lines 104-1~104-p, from the i/o signals 105-1~105-p. The output data are compared with desired data serving as the test write data. As a result of comparison, if two data coincide with each other, it verifies that there are no faults in the word line 102-1. If two data do not coincide with each other, it verifies that there are faults in the word line 102-1. Similar read and comparison are subsequently performed relative to the word lines 102-1~102-n. The test on the normal memory cell array 12 is completed upon completion of the read and comparison for relative to all the word lines 102-1~102-n.

A test on the redundant memory cell array 13 is described next. Suppose that the voltage level of the test signal 200 is H level.

The sub-decoder 20 decodes address information transferred from the address bus 100 and outputs the redundant word selection lines 201-1~201-m as decoding results. For example, address information for activating the redundant word line 202-1 is first inputted to the sub-decoder 20. The second control circuit 21 selects the redundant word selection lines 201-1~201-m and outputs the redundant word lines 202-1~202~m having voltage levels corresponding to the voltage level of the redundant word selection lines 201-1~201-m since the voltage level of the test signal 200 is H level.

Whereupon, the decoder 10 decodes address information outputted from the address bus 100 and outputs the decoded signals 101-1~101-n as decoding results. For example, if address information for instructing activation of the redundant word control line 103-1 is the same as that for instructing the activation of the word line 102-1, the decoder 10 outputs the decoded signals 101-1~101-n for instructing the activation word line 102-1. Since the voltage level of the test signal 200 is H level, the first control circuit 22 outputs the selection information 203-1~203-n (for example, all are at L level) which do not instruct the activation of all of the word lines 102-1~102-n. As a result, voltage levels of the word lines 102-1~102-n are all L level (inactivated).

Since the output of the decoder 10 is not used in the case of test on the redundant memory cell array 13, the operation of the decoder 10 may be inhibited if the voltage level of the test signal 200 is H level. In this case, the reduction of consumption current is expected.

Desired test data are written on the memory cells 13-11~13-1p which are selected by the activation of the word line 103-1. The write of data are performed by rendering the read/write signal 106 to be write instruction (for example, H level), and transferring desired write data from the i/o signals 105-1~105-p to the bit lines 104-1~104-p through the i/o circuit 14 so as to complete the above write of data.

When data are written, the selection of the bit lines 104-1~104-p may be performed by simultaneously selecting all the bit lines 104-1~104-p or by selecting one of bit lines 104-1~104-p (for example, bit line 104-1) first, then subsequently selecting remaining bit lines (in the order of bit lines 104-2~104-p). In the former case, time required for write is reduced.

The above operation is carried out in the manner that test address information for subsequently selecting remaining redundant word lines 202-2~202-m is inputted and respective redundant word lines 202-1~202-m are activated. Finally, desired data are written on all the memory cells 131-1~13-mp constituting the redundant memory cell array 13.

Next, the redundant word control line 103-1 is first activated like the write operation while the voltage level of the test signal 200 remains H level.

One of or all of the bit lines 104-1~104-p are selected as set forth above.

Suppose that the read/write signal 106 is at read instruction (for example, L level). The i/o circuit 14 outputs data, which are read from memory cells and transferred to the bit lines 104-1~104-p, from the i/o signals 105-1~105-p. The output data are compared with desired data serving as the test write data. As a result of comparison, if two data coincide with each other, it verifies that there are no faults in the redundant word line 202-1. If two data do not coincide with each other, it verifies that there are faults in the redundant word line 202-1.

Similar read and comparison are subsequently performed relative to the redundant word lines 202-1~202~m. The test on the redundant memory cell array 13 is completed upon completion of the read and comparison relative to all the redundant word lines 202-1~202-m.

As mentioned above, in the semiconductor memory 1 according to the first embodiment, it is possible to find the presence or absence of faults in advance not only in the normal memory cell array 12 but also in the redundant memory cell array 13. Accordingly, futile operation can be excluded by executing redundancy process in accordance with the respective test data.

Accordingly, the configuration for this can be realized by a normal semiconductor technique without adding a complex circuit.

Figure 5:
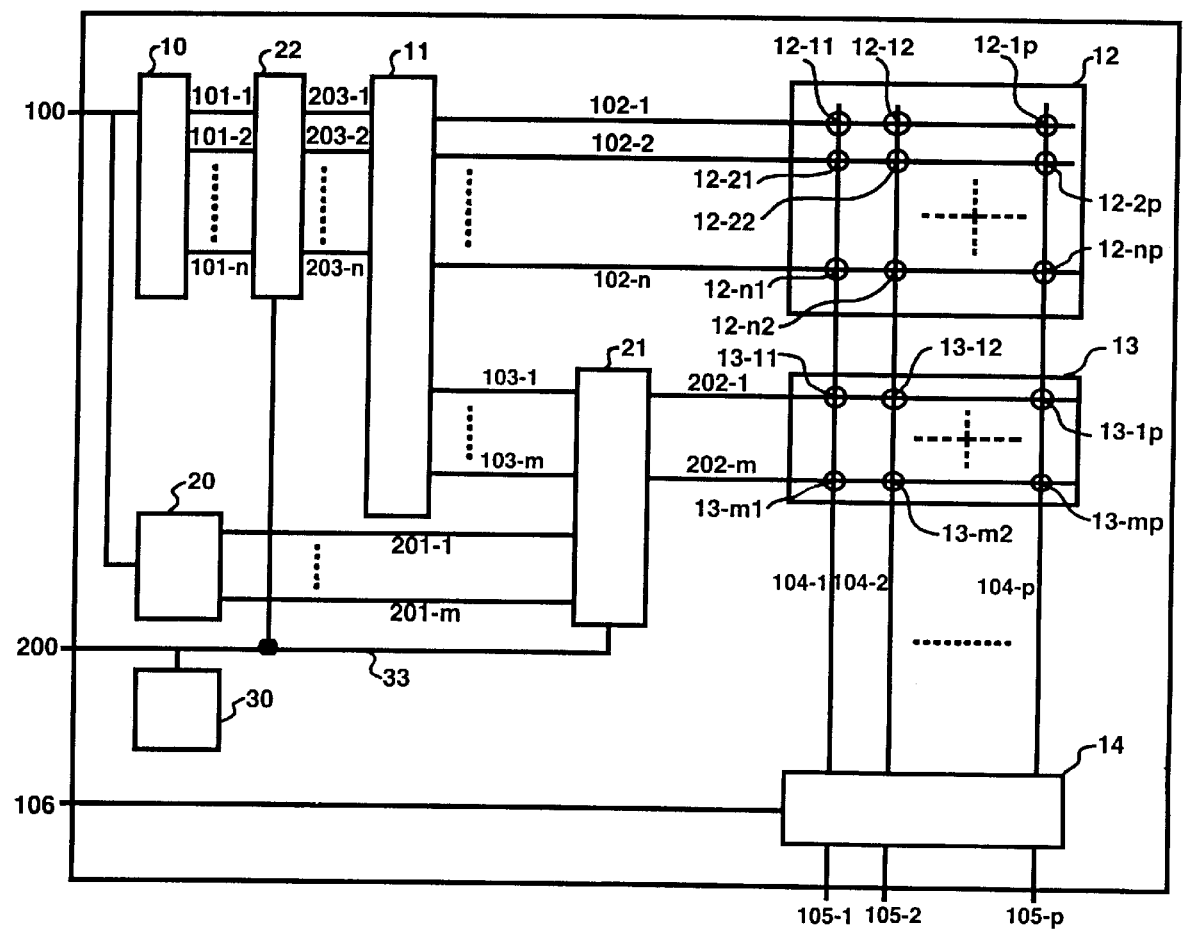
FIG. 5 is a circuit diagram of a semiconductor memory 2 according to a second embodiment of the invention.

Second Embodiment (FIG. 5):

FIG. 5 is a circuit diagram of a semiconductor memory 2 according to a second embodiment of the invention. Components which are the same as those of the semiconductor memory 1 in FIG. 1 are denoted by the same reference numerals.

In FIG. 5, the second embodiment is characterized by the provision of a set circuit 30. The set circuit 30 is connected to a wiring 33 for transmitting a test signal 200. The set circuit 30 is, for example, resistor means such as a resistor element. etc. connected between the ground voltage source and the wiring 33. It is necessary that the resistor means has high resistance (resistance value to the extent that the voltage level of the wiring 33 can be rendered H level in case that the voltage level of the test signal 200 is at least H level).

The set circuit 30 sets (fixes) the voltage level of the wiring 33 to L level when the normal operation is performed or test is made on a normal memory cell array 12. In other words, the voltage level of the wiring 33 is fixed to L level other than the case where the voltage level of the test signal 200 is H level.

As the semiconductor memory 2, in a sate where the test signal 200 is not inputted, the voltage level of the wiring 33 is rendered L level. As understood from the explanation from the first embodiment, if the voltage level of the wiring 33 is rendered L level, it is possible to perform a normal operation or to make a test on the normal memory cell array 12 without the input of the test signal 200.

If a test is made on the redundant memory cell array 13, the test signal 200 having H level at its voltage level is inputted. If the set circuit 30 is formed of resistor means having high resistance, the voltage level of the wiring 33 can keep H level. In this state, a test may as well be made on the redundant memory cell array 13 in the same manner as that of the first embodiment.

In the semiconductor memory 2 according to the second embodiment, it is possible to achieve the same effect as the first embodiment, and also achieve such effect that the transfer of data for the test signal 200 to the wiring 33 is not needed in a normal operation time and labor for preparing test data for the test signal 200 can be rendered in the test because the test signal 200 is not needed to be inputted thereto when the normal operation is performed or the test on the normal memory cell array 12.

The set circuit 30 is not limited to the configuration composed of resistor means, but it may be formed of any configuration if it has the same function as the resistor means. For example, it may be formed of a configuration for fixing the voltage level of wiring as a latch circuit capable of resetting. If the set circuit 30 is formed of the resistor means as mentioned above, the increase of the number of the components can be prevented.

Figure 6:
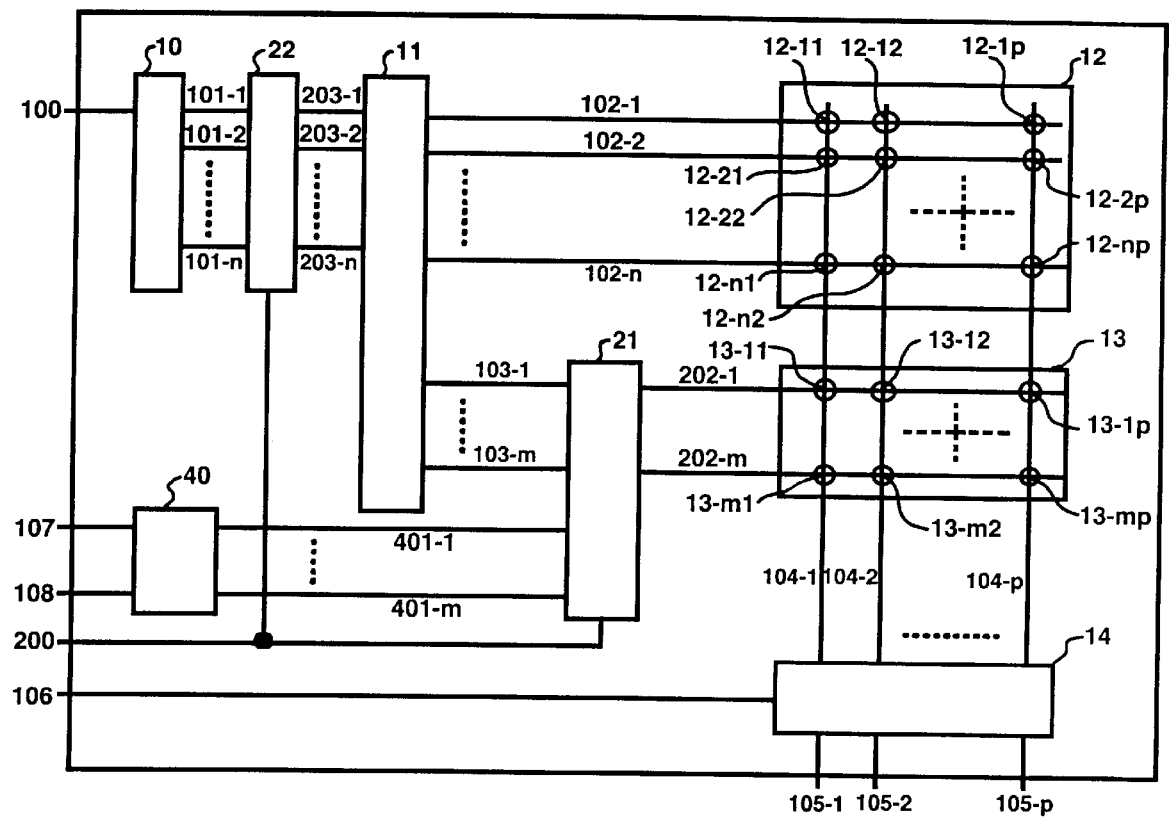
FIG. 6 is a circuit diagram of a semiconductor memory 3 according to a third embodiment of the invention.

Third Embodiment (FIGS. 6 and 7):

FIG. 6 is a circuit diagram of a semiconductor memory 3 according to a third embodiment of the invention. Components which are the same as those of the semiconductor memory 1 in FIG. 1 are denoted by the same reference numerals.

The semiconductor memory 3 of the third embodiment is characterized by the provision of a counter 40 instead of the sub-decoder 20. The counter 40 counts the number of clock pulses of a clock signal 107 and outputs count signals 401-1~401-m corresponding thereto. For example, if a first clock pulse is inputted from the clock signal 107 to the counter 40, the counter 40 renders the voltage level of the count signal 401-1 H level and renders the voltage level of other count signals L level. If a second clock pulse is inputted from the clock signal 107 to the counter 40, the counter 40 returns the voltage level of the count signal 401-1 to L level while rendering the voltage level of the count signal 401-2 H level and rendering the voltage of other count signals L level. Subsequently, if s clock pulses (s is integer expressed by $3 \leq s \leq m$) are inputted from the clock signal 107 to the counter 40, the counter 40 renders the voltage level of the count signals 401-s H level and renders the output level of other count signals L level. As understood from the above operation, the counter 40 can be realized by a shift resistor.

If the counter 40 receives a reset signal 108, it can reset the counting value to initial value (for example, voltage levels of the count signals 401-1~401-m are all rendered L level).

In the semiconductor memory 3 according to the third embodiment, the count signals 401-1~401-m outputted from the counter 40 are not selected by the second control circuit 21 at the time of normal operation or at the time of test on the normal memory cell array 12 (the voltage level of the test signal 200 is rendered L level), and hence the same operation as the first embodiment can be performed.

Figure 7:
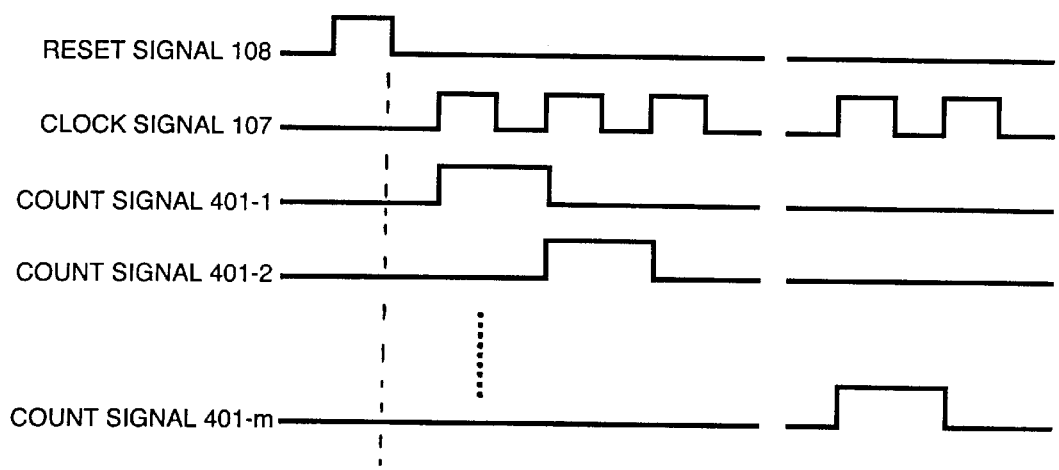
FIG. 7 is a timing chart of a counter 40 according to the third embodiment of the invention.

The test on the redundant memory cell array 13 will be described with reference to FIG. 7. FIG. 7 is a timing chart showing the operation of the counter 40 according to the third embodiment.

Suppose that the voltage level of the test signal 200 is H level and a reset signal reset signal 108 is inputted (one shot pulse is inputted) to the counter 40. The count signals 401-1~401-m of the counter 40 are all rendered at initial value (at L level). Thereafter, every time the clock pulses are subsequently inputted to the counter 40, the voltage levels of the count signals 401-1~401-m are subsequently rendered H level. Thereafter, data are written on the redundant memory cells which are selected during H level of respective count signals. Then, the reset signal 108 (one shot pulse) is inputted. If the count signal 401-m is returnedto the initial value after the counter 40 rendered the count signal 401-m at H level, it is not necessary to input the clock signal.

The count signals 401-1~401-m are all rendered at the initial value (all at L level). Then every time the clock pulses are inputted to the counter 40, the voltage levels of the count signals 401-1~401-m are subsequently rendered H level. Data from the redundant memory cells selected during the H level of the respective count signals are read. The read data are compared with desired data serving as test write data.

In the semiconductor memory 3 according to the third embodiment, there is obtained the same effect as the first embodiment and also it is not necessary to prepare test data for receiving the address information so as to make a test on the redundant memory cell array 13 because of the provision of the counter 40. Accordingly, the test process is further facilitated.

Figure 8:
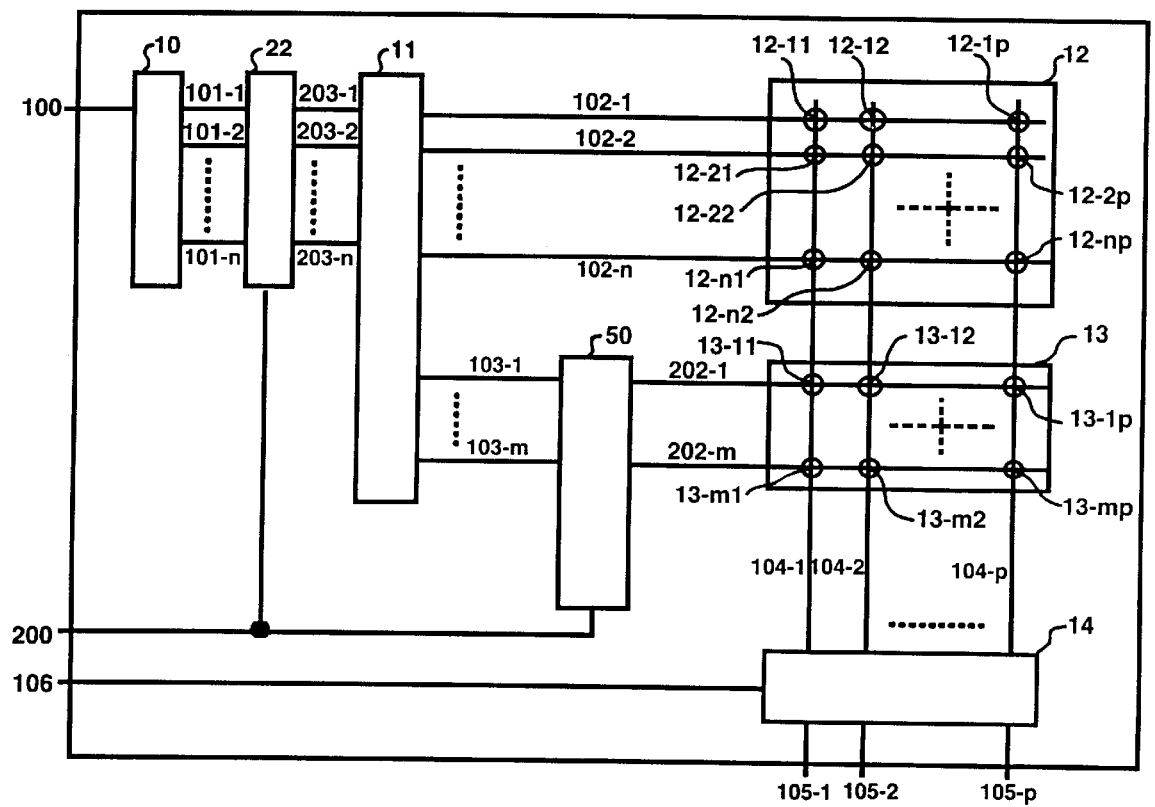
FIG. 8 is a circuit diagram of a semiconductor memory 4 according to a fourth embodiment of the invention.

Fourth Embodiment (FIG. 8):

A semiconductor memory according to a fourth embodiment of the invention will be now described with reference to the attached drawing. FIG. 8 is a circuit diagram of a semiconductor memory 4 according to the fourth embodiment of the invention. Components which are the same as those of the semiconductor memory 1 in FIG. 1 are denoted by the same reference numerals.

Characterized part in FIG. 8 is that the sub-decoder 20 is removed and a control circuit 50 which extends the function of the second control circuit 21 is provided instead of the second control circuit 21.

The control circuit 50 can activate all redundant word lines 202-1~202-m at the same time if the voltage level of a test signal 200 is H level. To realize the operation of the control circuit 50, for example, the AND gates 28-1~28-m of the circuit in FIG. 4 are removed, and the test signal 200 may be 20 inputted to one input terminals of the OR gates 29-1~29-m instead of the outputs of the AND gates 28-1~28-m.

In the semiconductor memory 3 according to the fourth embodiment, since an output of the control circuit 50 responds to the redundant word control lines 103-1~103-m in the normal operation or in the test on the normal memory cell array 12 (voltage level of the test signal 200 level is L level), the same operation as set forth in the above embodiments can be performed.

At this time of test on the redundant memory cell array 13, the voltage level of the test signal is rendered H level. The control circuit 50 activates all the redundant word lines 202-1~202-m in response to the voltage level of the signal 200. In this state, data is written on the redundant memory cells while the read/write signal 106 serves as light instruction data, so that desired data can be written on all the memory cells 13-1~13-mp constituting the redundant memory cell array 13 by once write instruction. Suppose that all the bit lines 13-1~13-mp 104-104-p are selected. The selection of these bit lines can be performed by using a circuit similar to the control circuit 50 in a circuit for controlling the selection of the bit lines.

Thereafter, it is possible to read data from all the memory cells 13-11~13-mp constituting the redundant memory cell array 13 by once read instruction while the read/write signal 106 serves as read instruction.

If read is performed by one operation, data which are read from a plurality of redundant memory cells (for example, redundant memory cells 13-11, . . . ,13-m1) are transferredto one bit line (for example, bit line 104-1). However, if there are faults in these redundant memory cells, these frequently occurs that desired data are not obtained For example, if a short is caused in the wiring, read data becomes "0" (equivalent to ground voltage level) even if write data is rendered to "1" (other than ground voltage level). There does not occur a problem even if data are read by one operation from the redundant memory cell array 13.

Referring to read, if intended to perform read for every redundant word lines, the circuit in FIG. 4 is further added to the control circuit 50, so that the control circuit 50 can selectively operate for outputting to activate all the redundant word lines at the time of write or to activate the redundant word lines individually at the time of read.

In the semiconductor memory 4 of the fourth embodiment, the same effect as the first embodiment can be obtained, and test time at the redundant memory cell array 13 can be further reduced.

Although the first to fourth embodiments of the invention are described in detail, the configuration of the invention is not limited to these embodiments. For example, the set circuit 30 which is the characterized part in the second embodiment can be added to the configuration of the third embodiment or fourth embodiment. Still further, the count circuit 40 which is the characterized part of the third embodiment my be applied to the configuration of the fourth embodiment so as to activate the redundant word lines individually.

Still further, although the DRAM is exemplified as the semiconductor memory in the above embodiments, the semiconductor memory is not limited to the DRAM but it may be a memory having a redundant memory cell array. Further, although the selection of the memory cells is performed by word lines in the above embodiments, it may be performed by lines having the equivalent selecting function (for example, lines for selecting bit lines) without limiting to the word lines if such lines have the function of executing redundant process.

As mentioned above, according to the semiconductor memory of the invention, it is possible to make the write/read test on the redundant memory cell array before replacement it by faults like the write/read test on the normal memory cell array.

It is possible to reduce the increase of a circuit configuration to the utmost for achieving the above object.

Further, it can achieve the above object and does not influence a normal operation.

Still further, it can achieve the above object and can reduce complexity of test operation to the utmost.

More still further, it can achieve the above object and can reduce test time to the utmost.

What is claimed is:

1. A semiconductor memory having a redundant memory cell comprising:

a memory cell array composed of a plurality of memory cells connected to word lines and bit lines for storing data therein;

a redundant memory cell array composed of a plurality of redundant memory cells connected to redundant word lines and the bit lines for storing data therein;

a decoder for decoding address information and outputting decoding result;

an activation circuit for controlling to activate word lines to be selected by selection information in response to the selection information or to activate redundant word lines corresponding to word lines which are inhibited in use when the word lines to be selected are inhibited in use;

a first control circuit connected to the decoder and the activation circuit for receiving a control signal having a first voltage level and a second voltage level, transferring the decoding result outputted from the decoder as selection information to the activation circuit when the control signal is at the first voltage level, and for outputting inhibition information as selection information for inhibiting each of the plurality of word lines when the control signal is at the second voltage level; and a second control circuit for receiving the control signal and for selectively activating the plurality of redundant word lines when the control signal is at the second voltage level.

2. The semiconductor memory according to claim 1, further comprising a sub-decoder for decoding the address information and outputting instruction information for instructing activation of the redundant word lines which are selected based on the address information, wherein the second control circuit activates the redundant word lines which are selected based on the instruction information.

3. The semiconductor memory according to claim 2, further comprising a set circuit connected to a wiring for transmitting the control signal for setting the wiring to the first voltage level.

4. The semiconductor memory according to claim 3, wherein the set circuit comprises resistor means connected between the wiring and means for supplying a second voltage.

5. The semiconductor memory according to claim 1, further comprising a set circuit connected to a wiring for transmitting the control signal for setting the wiring to the first voltage level.

6. The semiconductor memory according to claim 5, wherein the set circuit comprises resistor means connected between the wiring and means for supplying a second voltage.

7. The semiconductor memory according to claim 1, further comprising a counter for receiving a clock signal and counting the number of clock pulses of the clock signal and for outputting instruction information for instructing activation of the redundant word lines selected based on the number of clock pulses, and wherein the second control circuit activates the redundant word lines selected in accordance with the instruction information.

8. The semiconductor memory according to claim 7, wherein the counter initializes the number of clock pulses in response to a reset signal.

9. The semiconductor memory according to claim 1, wherein the second control circuit activates all the plurality of word lines in response to the control signal having the second voltage level.

10. The semiconductor memory according to claim 1, wherein the semiconductor memory is formed of a dynamic random access memory.

11. A semiconductor memory having a redundant memory cell comprising:

a memory cell array composed of a plurality of memory cells connected to word lines and bit lines for storing data therein;

a redundant memory cell array composed of a plurality of redundant memory cells connected to redundant word lines and the bit lines for storing data therein;

a decoder for decoding address information and outputting decoding result;

an activation circuit for controlling to activate word lines to be selected by selection information in response to the selection information or to activate redundant word lines corresponding to word lines which are inhibited in use when the word lines to be selected are inhibited in use;

a first control circuit connected to the decoder and the activation circuit for receiving a control signal having a first voltage level and a second voltage level, transferring the decoding result outputted from the decoder as selection information to the activation circuit when the control signal is at the first voltage level, and for outputting inhibition information as selection information for inhibiting each of the plurality of word lines when the control signal is at the second voltage level;

a sub-decoder for decoding the address information and outputting instruction information for instructing activation of the redundant word lines selected based on the address information; and a second control circuit for receiving the control signal and for selectively activating the plurality of redundant word lines when the control signal is at the second voltage level, wherein the second control circuit activates the redundant word lines selected in accordance with the instruction information.

12. The semiconductor memory according to claim 11, further comprising a set circuit connected to a wiring for transmitting the control signal for setting the wiring to the first voltage level.

13. The semiconductor memory according to claim 12, wherein the set circuit comprises resistor means connected between the wiring and means for supplying a second voltage.

14. The semiconductor memory according to claim 12, wherein the semiconductor memory is formed of a dynamic random access memory.

15. The semiconductor memory according to claim 11, wherein the semiconductor memory is formed of a dynamic random access memory.

* * * * *